US008321758B2

(12) United States Patent
Pescatore

(10) Patent No.: US 8,321,758 B2
(45) Date of Patent: Nov. 27, 2012

(54) DATA ERROR CORRECTION DEVICE AND METHODS THEREOF

(75) Inventor: John C Pescatore, Georgetown, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1082 days.

(21) Appl. No.: 12/186,135

(22) Filed: Aug. 5, 2008

(65) Prior Publication Data

US 2010/0037117 A1 Feb. 11, 2010

(51) Int. Cl.
*G11C 29/00* (2006.01)
(52) U.S. Cl. ........................ 714/763; 714/767
(58) Field of Classification Search .................. 714/752, 714/763; 717/767
See application file for complete search history.

(56) References Cited

U.S. PATENT DOCUMENTS

| 6,047,397 | A   | * | 4/2000  | Mons ............................ 714/763 |
|-----------|-----|---|---------|--------------------------------------------|
| 7,143,332 | B1  | * | 11/2006 | Trimberger .................... 714/763    |
| 7,406,649 | B2  | * | 7/2008  | Shimizume et al. .......... 714/773        |
| 7,523,380 | B1  | * | 4/2009  | Trimberger .................... 714/763    |
| 2002/0013924 | A1 | * | 1/2002 | Yamamoto .................... 714/763      |
| 2003/0023924 | A1 | * | 1/2003 | Davis et al. ................... 714/763   |
| 2006/0064624 | A1 | * | 3/2006 | Albrecht et al. .............. 714/763     |
| 2007/0150792 | A1 | * | 6/2007 | Ruckerbauer ................. 714/763      |
| 2008/0052601 | A1 | * | 2/2008 | Albrecht et al. .............. 714/763     |
| 2008/0184093 | A1 | * | 7/2008 | Thayer ......................... 714/763   |
| 2009/0177946 | A1 | * | 7/2009 | Dasari et al. .................. 714/763   |

* cited by examiner

*Primary Examiner* — Yolanda L Wilson

(57) ABSTRACT

A method of accessing a memory includes accessing multiple ECC words via a single memory channel. Portions of each ECC word are retrieved from different memory ranks, so that a failure in a memory device at one memory rank is less likely to result in uncorrectable errors in the data segment. By accessing the data segments via a single memory channel, rather than multiple memory channels, the single memory channel can be accessed independently, providing for lower cost memory modules, higher memory bandwidth, and lower power dissipation.

20 Claims, 3 Drawing Sheets

DATA ERROR CORRECTION DEVICE AND METHODS THEREOF

FIELD OF THE DISCLOSURE

The present disclosure relates to data processing devices and more particularly to error correction for data processing devices.

BACKGROUND

Data processing devices employ error correcting codes (ECC) to improve memory reliability. Typically, the ECC code is a set of checkbits calculated for a specified unit of data. The data and associated checkbits are collectively referred to as an ECC word. The number of errors that can be detected and corrected in an ECC word depend on the size of the word, and relative number of data bits and checkbits. For example, a 72 bit ECC word having 64 data bits and 8 checkbits is sufficient to detect any two bits in error, and sufficient to correct any single bit in error.

Each ECC word is typically stored in a memory module having multiple memory devices, whereby each memory device stores a portion of the ECC word. Failure of a memory device will therefore cause errors in the portion of the ECC word stored at the failed device. Accordingly, an increase in the size of memory devices can cause a commensurate increase in the number of bits in error in an ECC word resulting from a device failure. Although the increased impact can be addressed by increasing the size of the ECC word, the size increase could result in an undesirable change to the memory architecture (requiring, for example, an undesirable increase in bus width).

One technique to provide a larger ECC word is to "gang" memory channels, whereby two physical memory channels associated with different memory modules are combined into a single logical memory channel. In this arrangement, each access to memory results in parallel accesses to the two physical memory channels. The two physical memory channels thereby provide a larger ECC word than a single physical memory channel. However, ganging of memory channels can cause an undesirable impact in memory bandwidth due to inefficiencies of memory devices in supporting small burst lengths, sometimes referred to as the "burst chop" penalty. In addition, ganging of memory channels is difficult in data processing devices having an odd number of physical memory channels.

DETAILED DESCRIPTION

A method of accessing a memory includes accessing multiple ECC words via a single memory channel. Portions of each ECC word are retrieved from different memory ranks, so that a failure in a memory device at one memory rank is less likely to result in uncorrectable errors in the data segment. By accessing the data segments via a single memory channel, rather than multiple memory channels, the single memory channel can be accessed independently, providing for lower cost memory modules, higher memory bandwidth, and lower power dissipation.

Figure 1:
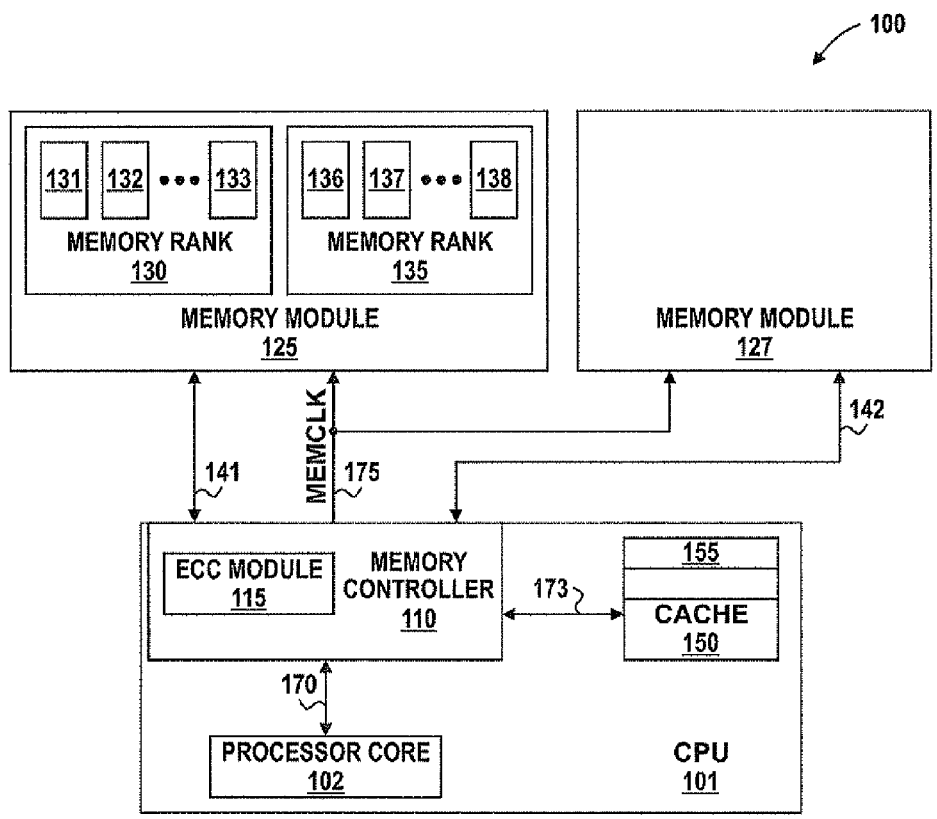
FIG. 1 is a block diagram of a data processing device in accordance with one embodiment of the present disclosure.

FIG. 1 illustrates a block diagram of a particular embodiment of a data processing device 100 including central processor unit (CPU) 101 and further including memory modules 125 and 127. The CPU 101 includes a processor core 102, a memory controller 110, and a cache 150. The processor 102 includes an input/output port connected to a bus 170. The memory controller 110 includes an input/output port connected to the bus 170, an output to provide a clock signal labeled MEMCLK, and input/output ports connected to memory channels 141 and 142. As used herein, a "memory channel" refers to a physical connection between a memory and a device, such as a memory controller, configured to access the memory. The memory controller 110 is also connected to the cache 150 via a bus 173. The memory module 125 includes an input/output port connected to the memory channel 141, while the memory module 127 includes an input/output port connected to the memory channel 142.

It will be appreciated that although for purposes of discussion the memory channels 141 and 142, as well as the bus 170, are illustrated as single bi-directional busses, each illustrated channel or bus can represent multiple uni-directional busses. For example, memory channel 141 can represent separate address and data busses. Further, it will be appreciated that although for purposes of discussion the clock signal MEMCLK is illustrated as a signal provided via a single connection, MEMCLK can represent multiple signals provided via multiple connections. For example, MEMCLK can represent multiple clock signals, data strobe signals, column and row select signals, rank select signals, and the like.

The memory modules 125 and 127 can be volatile memory, such as random access memory (RAM). Each of the memory modules 125 and 127 can be a separate physical module, such as a dual in-line memory module (DIMM) and the like, and can include one or more memory ranks. For example, the memory module 125 includes memory ranks 130 and 135. As used herein, a memory rank refers to a set of memory devices that are independently addressed from other sets of memory devices in other memory ranks. For example, memory rank 130 includes memory devices 131, 132, through memory device 133, while memory rank 135 includes memory devices 136, 137 through memory device 138. The devices of memory rank 135 are addressed independently from the devices of memory rank 130. Each memory device is configured to store multiple bits data, and provide data in specified unit sizes. The unit size is referred to as the width of the memory device. For example, a memory device configured to provide data in 8 bit units is referred to as an 8-bit wide, or "x8" memory device.

Each of the memory ranks 230 and 235 are configured to store data in a plurality of addressable memory locations, with each memory location including a plurality of memory segments. For purposes of discussion, a memory segment refers to the data provided by a memory rank in response to an edge of the MEMCLK signal. Each memory segment includes data stored at multiple memory devices. This can be better understood with reference to FIG. 2.

Figure 2:
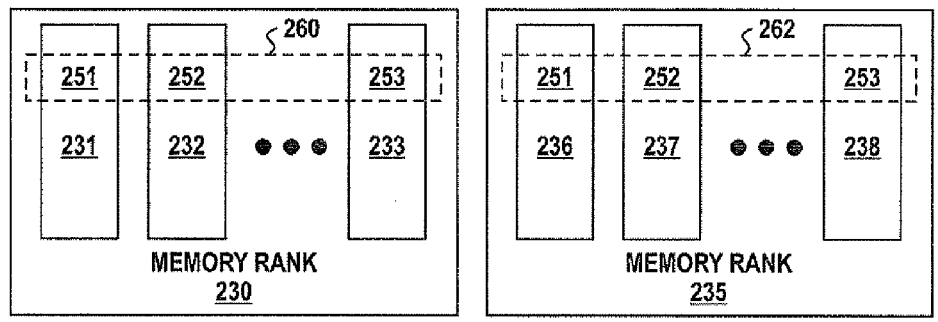
FIG. 2 is a block diagram illustrating a particular embodiment of a memory module of the data processing device of FIG. 1.

FIG. 2 illustrates a block diagram of a particular embodiment of memory ranks 230 and 235, corresponding to memory ranks 130 and 135 of FIG. 1. As illustrated, memory rank 230 includes memory devices 231, 232, through memory device 233, while memory rank 235 includes memory devices 236, 237, through 238. Each of the memory devices includes a number of memory portions, such as memory portions 251, 252, and 253. Each memory portion stores a number of bits corresponding to the width of the memory device. For example, if the memory device 231 is a x8 device, the memory portion 251 stores 8 bits of data per address.

The memory ranks 230 and 235 each include multiple memory segments. For example, memory rank 230 includes memory segment 261 while memory rank 235 includes memory segment 262. As illustrated, each memory segment includes memory portions from multiple memory devices. Thus, memory segment 261 includes memory portions 251, from memory device 231, and memory segment 252, from memory device 232. Thus failure at a single memory device only results in partial loss data at a memory segment.

Returning to FIG. 1, in the illustrated embodiment each of the memory devices 131-133 and 136-138 are assumed to be x8 memory devices. Further, each of the memory ranks is assumed to include 9 memory devices. Accordingly, in the illustrated embodiment of FIG. 1 each memory segment of a memory device is 72 bits wide.

Each memory segment of the memory module 125 is individually addressable according to a segment address. In response to receiving a segment address via memory channel 141, the memory module 125 is configured to provide the data stored at the memory segment corresponding to that address via the memory channel 141.

The processor core 102 can be a general purpose data processor or an application specific integrated circuit. For example, in an embodiment the processor core 102 is an x86 compatible processor core. The processor core 102 is configured to execute instructions at an instruction pipeline (not shown) in order to perform specified tasks. In conjunction with execution of the instructions, the processor core 102 can provide load or store commands via the bus 170. A load command represents a command to provide data associated with a designated memory address to the processor core 102, while a store command represents a command to store data at a designated memory address.

The cache 150 is a memory including a number of cache locations, such as cache line 155. The cache 150 is configured to associate particular cache lines with data associated with particular memory addresses. In the illustrated embodiment, each cache line is assumed to be 64 bytes wide.

The memory controller 110 is configured to retrieve and store data at the memory modules 125 and 127. To retrieve data, the memory controller 110 determines the memory segment addresses corresponding to the received memory address and provides the addresses via the memory channel corresponding to the addressed memory segments. The memory controller 110 is configured to retrieve data from the memory modules 125 and 127 in a burst access format, whereby a specified number of memory segments are retrieved in each burst. For example, in the illustrated embodiment of FIG. 1, the memory controller 110 is configured to retrieve data in a "burst four" format, so that four memory segments are retrieved in each burst. As set forth above, each memory segment corresponds to 72 bits of data so each burst access results in the transfer of 288 bits of data to the memory controller 110. The transfer of each memory segment occurs in response to a rising or falling edge of the clock signal MEMCLK, so that each burst four transfer requires two cycles of MEMCLK.

The memory controller 110 further includes an ECC module 115 configured to perform error correction on retrieved data. In particular, the ECC module is configured to perform error detection and correction on a specified amount of data and specified number of checkbits, referred to herein as an ECC word. For example, in the illustrated embodiment the ECC module 115 is assumed to be configured to perform error correction for an ECC word size 288 bits, including 256 data bits and 32 checkbits. Thus, in the illustrated embodiment, the ECC word size for the data processing device 100 corresponds to the amount of data that can be retrieved by the memory controller 110 in a single burst access (e.g. four 72 bit segments).

The memory controller 110 is further configured to receive and service load and store commands received via the bus 170. In response to a load command associated with a designated memory address, the memory controller 110 is configured to determine if a cache line at the cache 150 is associated with the memory address. If a cache miss is indicated, the memory controller 110 is configured to retrieve the requested data from the memory modules 125 and 127 and store the data at a cache line of the cache 150. In the illustrated embodiment, the memory controller 110 is configured to retrieve an amount of data sufficient to fill one cache line.

As explained above, each cache line of the cache 150 is configured to store 64 bytes, or 512 bits of data. This corresponds to the number of data bits in two ECC words for the data processing device 100. Accordingly, in response to a cache miss, the memory controller 110 retrieves two ECC words via two burst accesses from the memory module 125 or 127, performs error detection and correction on each of the ECC words, and provides the corrected data from each ECC word to the cache 150 for storage at a cache line.

Figures 3, 4:
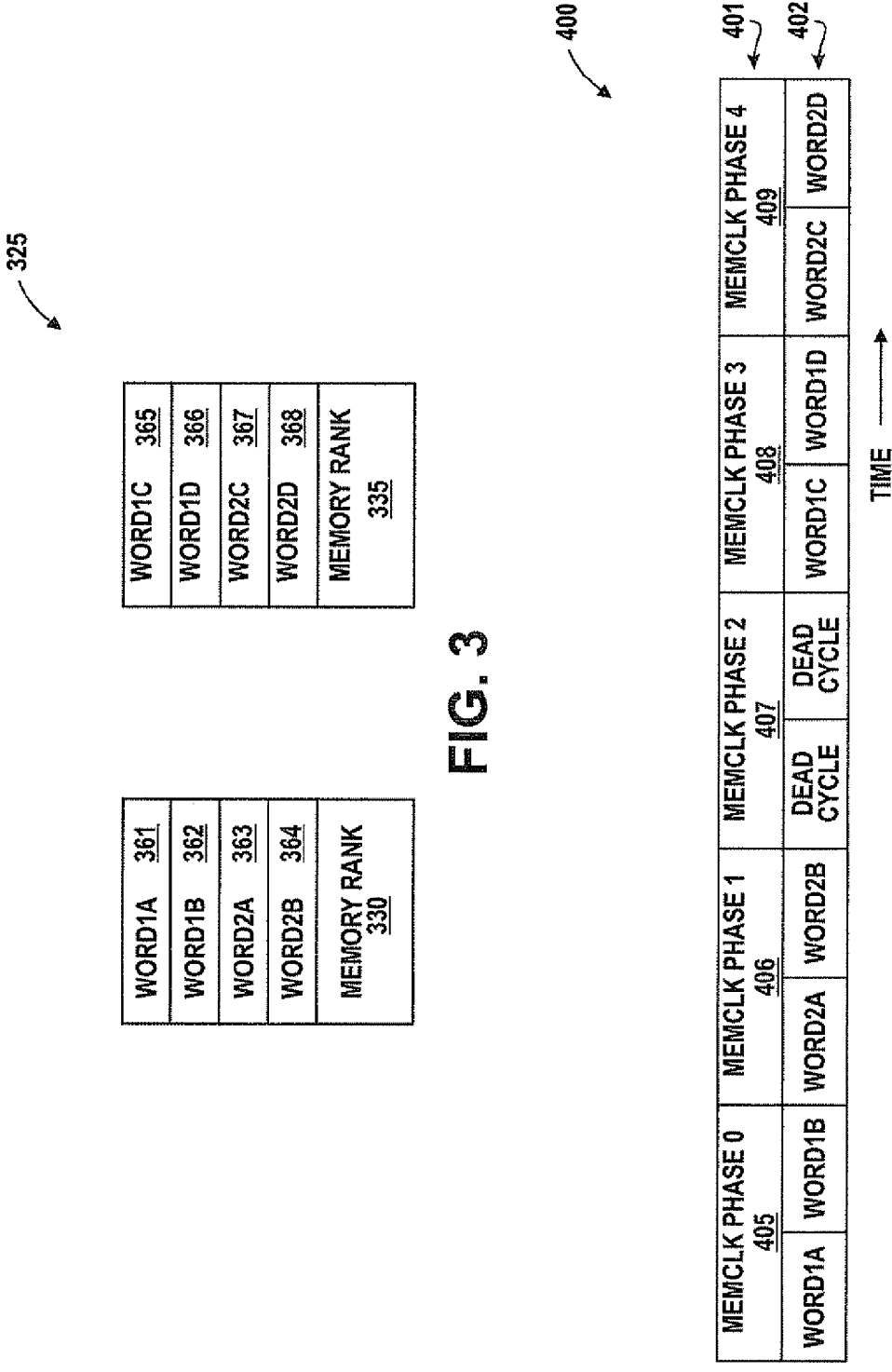
FIG. 3 is a block diagram illustrating another view of a particular embodiment of a memory module at the data processing device of FIG. 1.
FIG. 4 is a diagram illustrating a particular embodiment of a memory access to a memory module of FIG. 1.

In the illustrated embodiment of FIG. 1, ECC words are stored in the memory ranks of memory modules 125 and 127 in different memory segments, so that each ECC word can be retrieved in an interleaved fashion. This can be better understood with reference to FIG. 3, which illustrates a particular embodiment of memory ranks 330 and 335, corresponding to memory ranks 130 and 135 of FIG. 1. Each of the memory ranks 330 and 335 include a number of memory segments. Thus, memory rank 330 includes memory segments 361, 362, 363, and 364, while memory rank 335 includes memory segments 365, 366, 367, and 368.

In the illustrated embodiment, each memory segment of the memory ranks 361-368 stores a different 72-bit portion of one of two ECC words, designated as WORD1 and WORD2, respectively. Thus, memory segment 361 stores a first portion of WORD1 (labeled "WORD1A"), memory segment 362 stores a second portion of WORD1 (labeled "WORD1B"), memory segment 363 stores a first portion WORD2 (labeled "WORD2A"), memory segment 364 stores a second portion of WORD2 (labeled "WORD2B"). With respect to memory rank 335, memory segment 365 stores a third portion of WORD1 (labeled "WORD1C"), memory segment 366 stores a fourth portion of WORD1 (labeled "WORD1D"), memory segment 367 stores a third portion WORD2 (labeled "WORD2C"), memory segment 368 stores a fourth portion of WORD2 (labeled "WORD2D").

Accordingly, as illustrated, different portions of each ECC word are stored in different memory segments. This reduces the likelihood that failure of a single memory device will result in an uncorrectable error in an ECC word. For example, in the illustrated embodiment of FIG. 1 each ECC word includes 288 bits, with 32 checkbits. This is sufficient to correct up to 16 bits of errors in the ECC word. Further, each memory device is 8 bits wide, and therefore stores 8 bits of each memory segment in the associated memory rank. Thus, each 8-bit memory device at memory rank 330 stores an 8 bit portion of memory segments 361, 362, 363, and 364. Accordingly, failure of a single memory device would result in at most 8 bits of error in WORD1A and at most 8 bits of error in WORD1B, or a total of at most 16 bits of error in ECC word WORD1. The 16 bits of error are correctable in the 288 bit ECC word. Thus, the failure of a single memory device results does not result in uncorrectable errors in an ECC word.

Referring again to FIG. 1, to retrieve data from a memory module, the memory controller 110 accesses each memory rank of the memory module so that ECC words are retrieved in an interleaved fashion. This can be better understood with reference to FIG. 4, which illustrates a table 400 depicting a data retrieval sequence of ECC words WORD1 and WORD2 (FIG. 3) from memory module 125. Table 400 includes a row 401 depicting a series of MEMCLK phases, whereby each phase corresponds to a clock cycle having a rising edge and a falling edge. Row 402 illustrates the data communicated from the memory module 125 to the memory controller 110 during the associated MEMCLK period. Data corresponding to one memory segment can be communicated in response to either a rising or a falling edge of MEMCLK, so that two memory segments are communicated in each period. As illustrated, WORD1 and WORD2 are communicated via two burst accesses.

In particular, the first burst access includes period 405 and 406. During phase 405 memory segments 361 and 362, corresponding to WORD1A and WORD1B, are communicated via memory channel 141. During phase 406, memory segments 363 and 364, corresponding to WORD2A and WORD2B, are communicated. Accordingly, during the first burst access corresponding to phases 405 and 406, the memory segments at memory rank 170 are accessed.

During phase 407, the memory channel 141 experiences a "dead phase" which allows the drivers of the active rank of devices to turn off prior to the subsequent rank of devices to turn on. In the illustrated embodiment, because two different sets of devices are accessed sequentially, the burst chop penalty associated with sequentially accessing the same device is reduced.

In phases 408 and 409, memory rank 175 is accessed to retrieve the remainder of WORD1 and WORD2. In particular, during phase 408 memory segments 365 and 366, corresponding to WORD1C and WORD1D, are communicated. During phase 406, memory segments 367 and 368, corresponding to WORD2C and WORD2D, are communicated.

In response to receiving the communicated portions of WORD1 and WORD2, the memory controller 110 assembles the portions into the respective ECC words, and provides the ECC words to ECC module 115 for error detection and correction. The memory controller provides the corrected data bits from ECC words WORD1 and WORD2 to the cache 150 for storage in the corresponding cache line.

Thus, in the illustrated embodiment of FIG. 1, memory accesses are performed via a single memory channel. Two ECC words are communicated in an interleaved fashion, reducing the impact of a memory device failure on each ECC word, and allowing more errors to be corrected without the use of multiple memory channels in a ganged mode.

It will be appreciated that the techniques described with respect to FIG. 1 are applicable to single-rank memory modules. That is, in a particular embodiment, the memory ranks 130 and 135 can be located at separate memory modules associated with a single memory channel.

Figure 5:
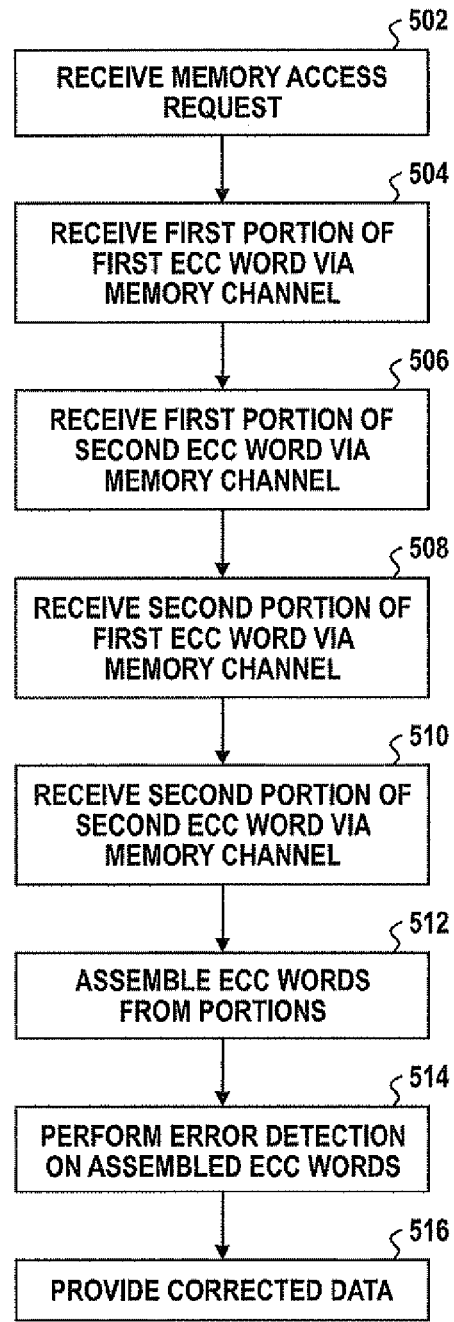
FIG. 5 is a flow diagram of a method of accessing a memory in accordance with one embodiment of the present disclosure.

Referring to FIG. 5, a flow diagram of a particular embodiment of a method of accessing a memory is illustrated. At block 502, a memory access request is received. In an embodiment, the memory access request is a request received at a memory controller to retrieve one or more data segments from memory. At block 504, in response to the memory access request a first portion of a first data segment is received via a memory channel. At block 506, in response to the memory access request a second portion of a second data segment is received from a memory via the memory channel. In an embodiment, both the first portion of the first segment and the first portion of the second segment are stored at a common rank of the memory.

At block 508, a second portion of the first data segment is received via the memory channel. At block 510, a second portion of the second data segment is received from the memory via the memory channel. In an embodiment, both the second portion of the first segment and the second portion of the second segment are stored at a common rank of the memory, and are stored at a different rank than that which stores the first portion of each segment.

At block 512, the first and data segments are assembled based on the retrieved data portions. At block 514 error detection is performed on the assembled data segments. In an embodiment, one or both of the portions of the data segments include ECC checkbits for the data segment, and error correction is performed using the ECC checkbits for each data segment. At block 516, the error-corrected data segments are provided in response to the memory access request. In one embodiment, the data segments are provided to a cache for storage.

Figure 6:
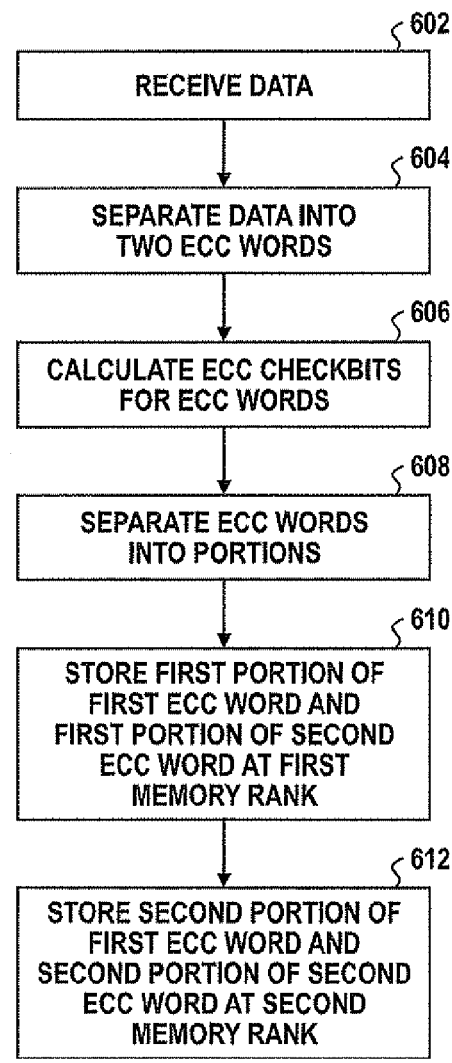
FIG. 6 is a flow diagram of a method of accessing a memory in accordance with another embodiment of the present disclosure.

Referring to FIG. 6, a flow diagram of a particular embodiment of a method of accessing a memory is illustrated. At block 602, data is received at a memory controller. In an embodiment, the data is received from a non-volatile memory such as a hard disk or flash memory. At block 604, the data is separated into data segments. At block 606, the memory controller calculates ECC checkbits for each data segment. At block 608, each data segment is separated into portions. One or more of the portions can include the ECC checkbits calculated for the associated data segment. At block 610, a first portion of the first data segment and a first portion of the second data segment are each stored at a first memory rank of a memory. At block 612, a second portion of the first data segment and a second portion of the second data segment are stored at a second memory rank of the memory, different from the first rank.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:
1. A method, comprising:
   receiving a first memory access request;
   receiving a first portion of a first error correction code (ECC) word via a first memory channel during a first time phase and a second portion of the first ECC word via the first memory channel during a second time phase in response to the first memory access request; and receiving a first portion of a second ECC word via the first memory channel during a third time phase in response to the first memory access request, the third phase after the first time phase and prior to the second time phase, and receiving a second portion of the second ECC word during a fourth time phase, the fourth time phase after the second.

2. The method of claim 1, wherein receiving the first portion of the first ECC word comprises receiving the first portion of the first ECC word from a first memory rank, and receiving the second portion of the first ECC word comprises receiving the second portion of the first ECC word from a second memory rank.

3. The method of claim 2, wherein receiving the first portion of the second ECC word comprises receiving the first portion of the second ECC word from the first memory rank, and receiving the second portion of the second ECC word comprises receiving the second portion of the second ECC word from the second memory rank.

4. The method of claim 2, wherein the first memory rank is associated with a first memory module and the second memory rank is associated with a second memory module.

5. The method of claim 2, wherein the first memory rank and the second memory rank are associated with a common memory module.

6. The method of claim 1, further comprising storing the first ECC word and second ECC word at a common cache line of a cache.

7. The method of claim 1, further comprising:
receiving a third portion of the first ECC word via the first memory channel during a fifth time phase, the fifth time phase after the first time phase and prior to the third time phase.

8. The method of claim 7, wherein the first portion of the first ECC word and the third portion of the first ECC word are stored at different addressable memory locations of a common memory rank.

9. The method of claim 7, further comprising:
receiving a third portion of the second ECC word via the first memory channel during a sixth time phase, the sixth time phase after the third time phase and prior to the second time phase.

10. The method of claim 9, wherein the first portion of the second ECC word and the third portion of the second ECC word are stored at different addressable memory locations of a common memory rank.

11. A method, comprising:
receiving a first error correction code (ECC) word, the first ECC word including ECC checkbits, a first data portion, and a second data portion; and in response to receiving the first ECC word, storing both the ECC checkbits and the first data portion at a first memory rank and the second data portion at a second memory rank, the first memory rank and the second memory rank associated with a common memory channel.

12. The method of claim 11, wherein the first rank and the second rank are associated with a common memory module.

13. The method of claim 11, wherein the first rank and the second rank are associated with different memory modules.

14. The method of claim 11, further comprising calculating first error correction code (ECC) information for the first ECC word.

15. A device, comprising:
a first memory channel coupleable to a memory; and
a memory controller coupled to the first memory channel and comprising an input configured to receive a memory access request, the memory controller configured to:
receive a first portion of a first error correction code (ECC) word via the first memory channel during a first time phase;
receive a second portion of the first ECC word via the first memory channel during a second time phase, the second time phase after the first;
receive a first portion of a second ECC word via the first memory channel during a third time phase, the third time phase after the first and prior to the second time phase; and
receive a second portion of the second ECC word via the first memory channel during a fourth time phase, the fourth time phase after the second time phase.

16. The device of claim 15, wherein the memory comprises a first memory rank and a second memory rank, and wherein the memory controller is configured to receive the first portion of the first ECC word from the first memory rank, and is configured to receive the second portion of the first ECC word from a second memory rank.

17. The device of claim 16, wherein the memory controller is configured to receive the first portion of the second ECC word from the first memory rank, and is configured to receive the second portion of the second ECC word from the second memory rank.

18. The device of claim 16, wherein the memory comprises a memory module, and the first rank and second rank are associated with the memory module.

19. The device of claim 16, wherein the memory comprises a first memory module and a second memory module, and wherein the first rank is associated with the first memory module and the second rank is associated with the second memory module.

20. The device of claim 15, further comprising a cache, the memory controller configured to store the first ECC word and the second ECC word at a common line of the cache.

* * * * *